(12) United States Patent
Piirainen et al.

(10) Patent No.: US 7,889,798 B2
(45) Date of Patent: Feb. 15, 2011

(54) PAR REDUCTION FOR EDGE CLIPPER

(75) Inventors: Olli Piirainen, Oulu (FI); Miia Karjalainen, Oulu (FI)

(73) Assignee: Nokia Corporation, Espoo (FI)

( * ) Notice: Subject to any disclaimer, the term of this patent is extended or adjusted under 35 U.S.C. 154(b) by 2013 days.

(21) Appl. No.: 10/627,962

(22) Filed: Jul. 28, 2003

(65) Prior Publication Data

US 2004/0240574 A1 Dec. 2, 2004

(30) Foreign Application Priority Data

May 28, 2003 (GB) ................................. 0312213.2

(51) Int. Cl.
  *H04K 1/10* (2006.01)
(52) U.S. Cl. ....................... 375/260; 375/146; 375/148; 375/295; 375/296; 375/297; 375/300; 375/343
(58) Field of Classification Search ................. 375/146, 375/148, 295, 296, 297, 300, 343
See application file for complete search history.

(56) References Cited

U.S. PATENT DOCUMENTS

| | | | | |
|---|---|---|---|---|
| 5,436,940 A | * | 7/1995 | Nguyen ....................... | 375/240 |
| 5,568,519 A | * | 10/1996 | Baier et al. ................... | 375/343 |
| 5,638,403 A | * | 6/1997 | Birchler et al. .............. | 375/296 |
| 5,727,026 A | * | 3/1998 | Beukema ..................... | 375/296 |
| 5,963,091 A | * | 10/1999 | Chen et al. .................. | 330/151 |
| 6,308,562 B1 | * | 10/2001 | Abdallah et al. ......... | 73/152.18 |
| 6,366,619 B1 | * | 4/2002 | McCallister et al. ........ | 375/295 |
| 6,392,483 B2 | * | 5/2002 | Suzuki et al. ............... | 330/151 |
| 6,504,862 B1 | * | 1/2003 | Yang .......................... | 375/146 |
| 6,522,747 B1 | * | 2/2003 | Reilly et al. ........... | 379/406.14 |
| 6,687,511 B2 | * | 2/2004 | McGowan et al. ........... | 455/522 |
| 7,012,970 B2 | * | 3/2006 | Greenwood et al. ......... | 375/296 |
| 7,054,385 B2 | * | 5/2006 | Booth et al. ................. | 375/300 |
| 7,061,990 B2 | * | 6/2006 | Wright et al. ............... | 375/296 |
| 7,095,798 B2 | * | 8/2006 | Hunton ....................... | 375/296 |

(Continued)

FOREIGN PATENT DOCUMENTS

GB    2364488    1/2002

OTHER PUBLICATIONS

Vaananen, O.; Vankka, J.; Halonen, K., *Effect of Baseband Clipping in Wideband CDMA System*, Spread Spectrum Techniques and Applications, 2002 IEEE Seventh International Symposium, vol. 2, Issue, Sep. 2-5, 2002, pp. 445-449, Digital object identifier 10.1109/ISSSTA.2002.1048581.

(Continued)

*Primary Examiner*—Chieh M Fan
*Assistant Examiner*—Siu M Lee
(74) *Attorney, Agent, or Firm*—Alston & Bird LLP

(57) ABSTRACT

A method of reducing the peak-to-mean ratio of a multi-carrier signal includes the steps of: generating a residual signal from the multicarrier signal, the residual signal representing the difference between the multicarrier signal and a hard-clipped multicarrier signal. The method also includes the steps of applying a least squares function to the residual signal for each carrier of the multi-carrier signal, thereby generating a minimized residual signal for each carrier and combining the minimized residual signals and the multicarrier signal.

20 Claims, 4 Drawing Sheets

U.S. PATENT DOCUMENTS

| | | | |
|---|---|---|---|
| 7,305,057 B1 * | 12/2007 | Miao | 375/350 |
| 2001/0006359 A1 * | 7/2001 | Suzuki et al. | 333/14 |
| 2001/0014114 A1 * | 8/2001 | Baltersee et al. | 375/148 |
| 2002/0101936 A1 * | 8/2002 | Wright et al. | 375/296 |
| 2002/0152253 A1 * | 10/2002 | Ricks et al. | 708/520 |
| 2003/0054851 A1 * | 3/2003 | Jo et al. | 455/522 |
| 2003/0086507 A1 * | 5/2003 | Kim et al. | 375/297 |
| 2003/0137949 A1 * | 7/2003 | Roux et al. | 370/317 |
| 2004/0076247 A1 * | 4/2004 | Barak et al. | 375/350 |
| 2004/0090283 A1 | 5/2004 | Naito | |
| 2004/0203430 A1 * | 10/2004 | Morris | 455/67.11 |
| 2005/0163248 A1 * | 7/2005 | Berangi et al. | 375/296 |
| 2005/0185736 A1 * | 8/2005 | Pajukoski | 375/296 |

OTHER PUBLICATIONS

Vaananen, O.; Vankka, J.; Halonen, K., *Reducing the Peak to Average Ratio of Multicarrier GSM and Edge Signals*, Electronic Circuit Design Laboratory, Helsinki Univ. of Technology, Espoo, Finland, Personal, Indoor and Mobile Radio Communications, 2002, The 13th IEEE International Symposium, Publication Date Sep. 15-18, 2002, vol. 1, pp. 115-119. Chinese Office Action from Chinese Patent Application No. 200410044601.9 dated Jan. 4, 2008.

Chinese Office Action from Chinese Patent Application No. 200410044601.9 dated Jan. 4, 2008.

* cited by examiner

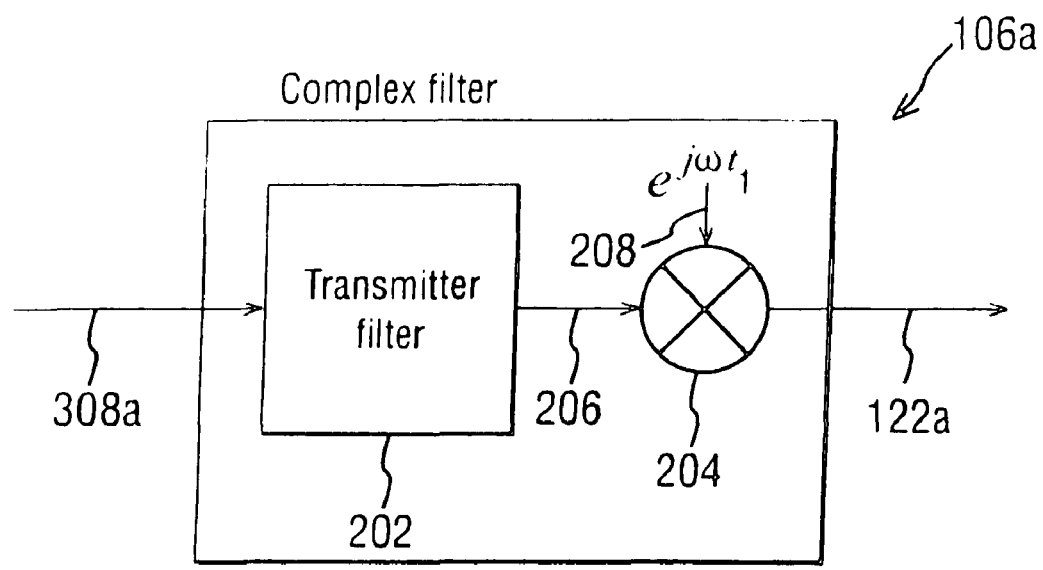
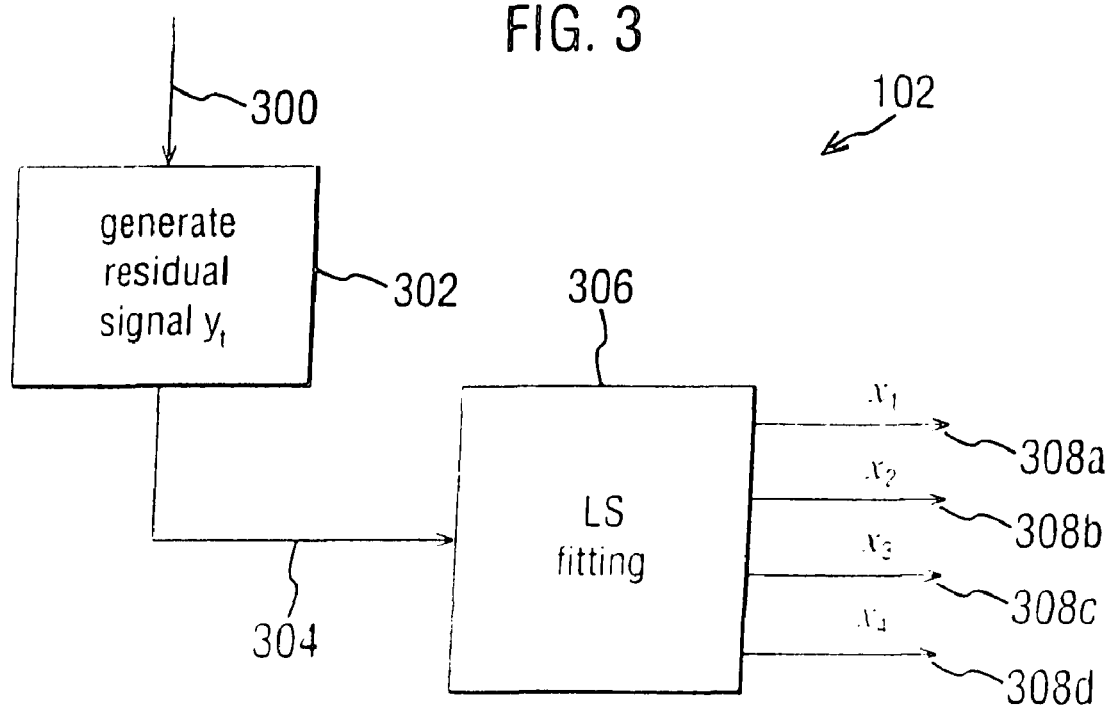

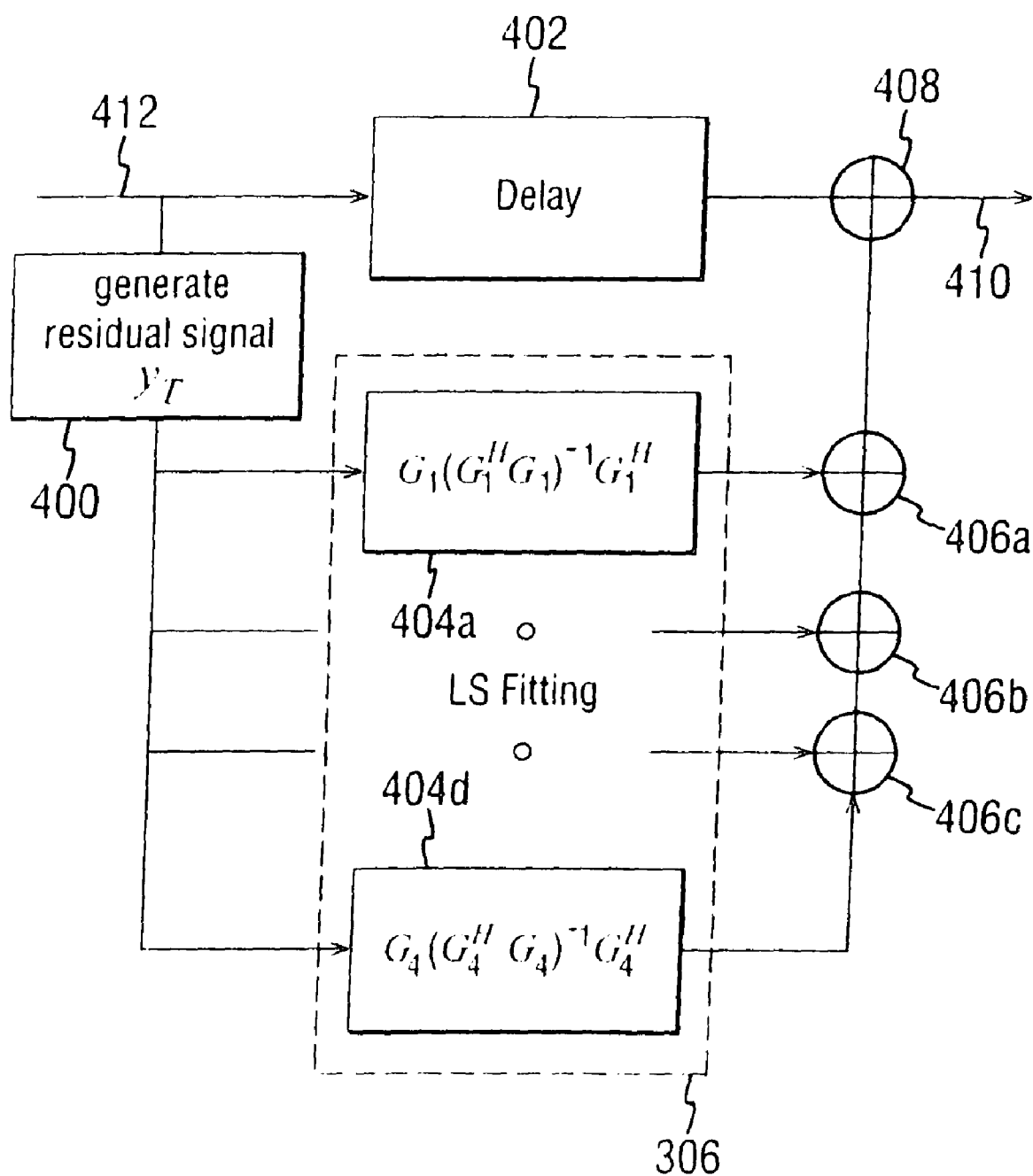

PAR REDUCTION FOR EDGE CLIPPER

BACKGROUND OF THE INVENTION

1. Field of the Invention

The invention relates to the reduction of the peak-to-mean average amplitude in a signal transmitted in a power amplifier, and particularly but not exclusively to such reduction in the power amplifier of a multicarrier communication system utilizing an EDGE clipper.

2. Description of the Related Art

Mobile communication systems, such as enhanced data rates for GSM (Global System for Mobile communications) evolution (EDGE) systems, utilize a power amplifier in a transmitter at the base transceiver station for transmitting signals.

It is known that a signal with a high peak-to-mean (average) ratio (PAR) sets high requirements for power amplifier linearity, and therefore reduces achievable power efficiency and increases the power consumption of the power amplifier. In order to improve efficiency, algorithms are utilized to reduce the peak-to-mean ratio of a transmitted EDGE signal. Nevertheless, system requirements set limits for achievable PAR reduction. The main transmission requirements are the signal frequency, peak EVM (Error Vector Magnitude) amplitude, and RMS (Root Mean Square) EVM.

Clipping algorithms provide one method to reduce the PAR, but at the cost of increasing the EVM of the transmitted signal. Different clipping algorithms have been previously studied in the case of WCDMA (Wideband Code Division Multiple Access) signals, and as a result some algorithms have been proposed for implementation. In the case of multicarrier EDGE signaling, the topic of clipping has been specifically studied.

The challenge is to minimize the PAR, but preferably without compromising the frequency requirement, the peak EVM requirement, and the RMS EVM requirement of the transmitted signal.

There has been ongoing discussion about different methods to minimize peak-to-average ratio (PAR) in EDGE transmissions. Minimizing PAR in EDGE enhances the achievable efficiency of the power amplifier. However in known suggested solutions the time-domain properties of the PAR reduced signal can be quite rapidly deteriorated.

SUMMARY OF THE INVENTION

The invention provides a method of reducing the peak-to-mean ratio of a multi-carrier signal. The method includes the steps of: generating a residual signal from the multicarrier signal, the residual signal representing the difference between the multicarrier signal and a hard-clipped multicarrier signal; applying a least squares function to the residual signal for each carrier of the multi-carrier signal, thereby generating a minimized residual signal for each carrier; and combining the minimized residual signals and the multicarrier signal.

The method may further include the step of, prior to the step of combining the minimized residual signals, of filtering each minimised residual signal.

The method may further include the step of delaying the multicarrier signal, wherein the delayed multicarrier signal is combined with the minimized residual signals.

The step of generating the residual signal may include a step of clipping the multicarrier signal to a predetermined level to thereby generate the hard-clipped multicarrier signal.

The step of filtering may include complex filtering. The step of filtering may include a step of multiplying the residual signal by a projection matrix of each carrier's spanned signal space. The step of filtering may include the steps of applying to the residual signal, for each carrier, a matrix function, a sampling function, a filtering function and an interpolation function.

The method may be applied in a mobile communication system.

In a further embodiment the invention provides an apparatus for reducing the peak-to-mean ratio of a multi-carrier signal. The apparatus includes: generating means for generating a residual signal from the multicarrier signal. The residual signal represents the difference between the multi-carrier signal and a hard-clipped multicarrier signal. The apparatus includes applying means for applying a least squares function to the residual signal for each carrier of the multi-carrier signal, thereby generating a minimized residual signal for each carrier; and combining means for combining the minimized residual signals and the multicarrier signal.

The apparatus may further include means for filtering each minimized residual signal prior to combining.

The apparatus may further include means for delaying the multicarrier signal, wherein the delayed multicarrier signal is combined with the minimized residual signals.

The means for generating the residual signal may include means for clipping the multicarrier signal to a predetermined level to thereby generate the hard-clipped multicarrier signal.

The means for filtering may include a complex filter. The means for filtering may include means for multiplying the residual signal by a projection matrix of each carrier's spanned signal space.

The means for filtering may include means for applying to the residual signal, for each carrier, a matrix function, a sampling function, a filtering function and an interpolation function.

In a further embodiment the invention provides a mobile communication system including a transmitter apparatus adapted for reducing the peak-to-mean ratio of a multi-carrier signal. The apparatus includes: generating means for generating a residual signal from the multicarrier signal. The residual signal represents the difference between the multi-carrier signal and a hard-clipped multicarrier signal. The apparatus includes applying means for applying a least squares function to the residual signal for each carrier of the multi-carrier signal, thereby generating a minimized residual signal for each carrier; and combining means for combining the minimized residual signals and the multicarrier signal.

The mobile communication system may be a GSM EDGE mobile communication system.

BRIEF DESCRIPTION OF THE DRAWINGS

The invention is described herein by way of reference to the accompanying drawings in which:

FIG. 2 illustrates an example implementation of part of the implementation of FIG. 1 according to an embodiment of the invention;

FIG. 3 illustrates an example implementation of part of the implementation of FIG. 1 according to an embodiment of the invention;

FIG. 4 illustrates an alternative example implementation of an embodiment of the present invention according to an embodiment of the invention.

DETAILED DESCRIPTION OF THE PREFERRED EMBODIMENTS

Figure 1:
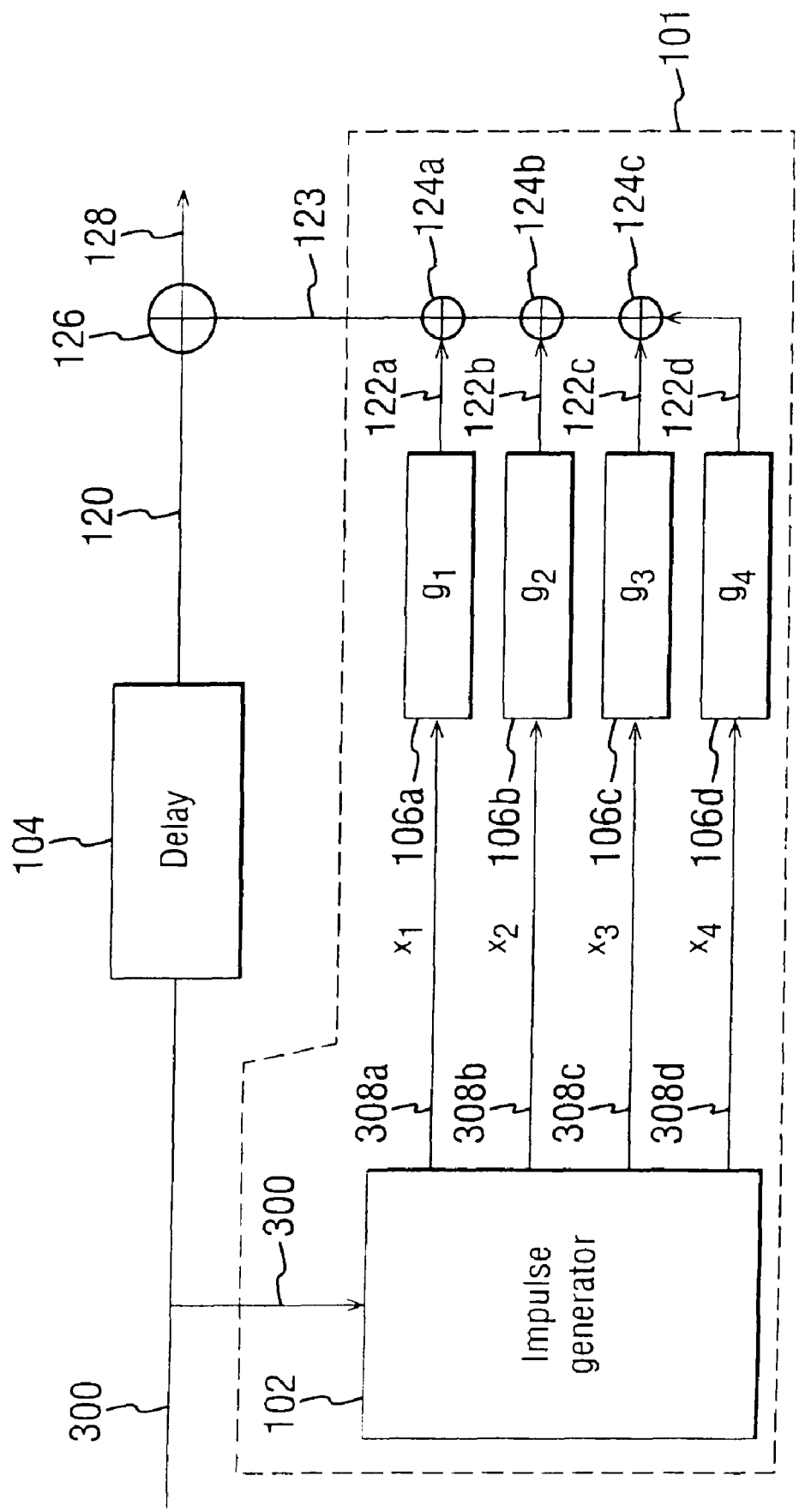
FIG. 1 illustrates an example implementation of an embodiment of the invention.

The invention is described herein by way of reference to examples of the embodiments of the invention. The invention is described, in particular, by way of reference to an implementation including a power amplifier in a multicarrier EDGE system. In the described embodiments, a system having four carriers is illustrated. The invention may, however, apply to multicarrier systems having any number of carriers.

A system model is first considered. A signal under evaluation can be modeled as a complex envelope, as follows:

$$y(t) = \sum_{i=1}^{no\_of\_carriers} A(t,i)e^{(j\omega_1 t + \phi_i)}, \qquad \text{Equation (1)}$$

where $A(t,i)$ is a term defined by carrier modulation and $e^{(j\omega_i t + \phi_i)}$ describes a frequency location of a single carrier signal within a multicarrier band, and the phase offset between them i represents the ith carrier within the multicarrier band.

According to one embodiment of the invention, the aim is to minimize the peak-to-mean ratio (PAR) of the transmitted signal. The PAR may be defined as follows:

$$PAR = \sqrt{\frac{\max(|y(t)|^2)}{\text{mean}(|y(t)|^2)}}$$

As discussed above, it is important to minimize the PAR without affecting certain other transmission requirements, namely the frequency requirements of a carrier, the peak amplitude EVM of the carrier, and the RMS EVM of the carrier.

The frequency requirements of a transmitted carrier primarily require that the error signal must be located in the same frequency bands as the actual signal is located. This is because the error signal is part of the transmitted signal and it must fulfill the transmitter requirements.

According to the GSM (Global System for Mobile communications) specifications, the maximum peak EVM value must be no more than 22% greater than the average of peak values, measured from 200 bursts.

The requirements for the RMS EVM under normal operating conditions, and without the effect of passive combiners, is 7.0%.

By checking the signal model defined in equation (1), it can be seen that there are effectively three different options for reducing the PAR of the output signal. In the first option, the terms $A(t,i)$ can be modified so that the PAR is minimized. This option can be considered as "clipping", as the modification of the terms $A(t,i)$ creates an amplitude error (EVM) in the output signal. In the second option, the frequency $\omega_i$ terms of each carrier can be adjusted. However this causes a frequency error in the transmitted signal, and as such the ability to modify this term is limited by the system specifications. A third option is to adjust the phase offset $\phi_i$ of each carrier. If such adjustment is done on a burst basis, it does not cause any error in the transmitted signal.

The second option is not a practical option for minimizing the PAR, due to the introduction of a frequency error. The first and third options do, however, offer alternatives for minimizing the PAR. The third option may be preferably considered as an alternative or supporting option for clipping algorithms.

An optimal clipping without any constraints (for the system parameters: frequency response, peak EVM, RMS EVM) can be written as a solution to an optimization problem, namely:

$$J = \min_y(|r-y|^2) + \lambda(|y| \leq A) \qquad \text{Equation (2)}$$

where J is the clipping function, r is a reference signal, y is a created output signal from the clipper, A describes the amplitude limit, and $\lambda$ is the Lagrange multiplier. It can be seen that the optimal clipper for the signal envelope to achieve this function is a hard-clipper, which limits the amplitude of the complex envelope of the baseband signal.

A "real" clipper has additional constraints which have to be fulfilled. These constraints, as discussed above, include the frequency spectrum constraints and the peak EVM constraints, and may include the RMS EVM constraints. As these additional constraints must degrade the theoretical achievable performance of the clipper compared to the results presented by equation (2) above, the real clipper inevitably provides a worse performance than the idealized solution of equation (2).

In order to consider more fully what may be an optimal hard clipper implementation for real constraints, the cost function of equation (2) is modified to give a cost function which is approximated by the following function:

$$J = \min_y(|r-y|^2) + \lambda(|y| \leq A) + \Sigma \rho_i((r-y)^H P(r-y) \leq b_i) + \Sigma \xi_i (|r_i - y_i| \leq p), \qquad \text{Equation (3)}$$

where J is the clipping function, the term $\Sigma \rho_i((r-y)^H P(r-y) \leq b_i)$ defines the frequency spectrum constraints for each sub-band separately, and the last term defines the peak EVM constraints. Equation (3) thus represents the function of equation (2) modified to take into account the frequency spectrum and peak EVM constraints.

The foregoing analysis of the invention sets out that a "hard-clipper" implementation provides an optimum solution, if there are no additional constraints on the system. If there are additional constraints, then the optimum solution of the "hard-clipper" cannot be achieved.

The cost function of equation (3) is only an approximation of the real constraints, and is used here to show the properties of a 'good clipper'.

The solution to the cost function of equation (3) may be found using Kuhn-Tucker conditions, but this leads to a fairly complex clipping algorithm. It is therefore not proposed to use Kuhn-Tucker conditions. Instead, the impact of the added constraints, frequency spectrum and peak EVM (and RMS EVM), to the properties of the error signal e are considered. In order to consider the error signal, it is necessary merely to consider the characteristics of such signal, rather than its mathematical construction.

As discussed above, the frequency spectrum (domain) requirements mainly require that the error signal must be located in the same frequency bands as the actual signal is located. If the frequency constraints of the cost function J in equation (3) are considered, it is known from the Kuhn-Tucker conditions that the function is minimized when each constraint is either 0 or $b_i$, depending on the signal characteristics. As the constraints are relatively tight, it is very probable that the optimum solution is found when $\Sigma(\rho_i(r-y)^H P(r-y) = b_i$, rather than 0. On the other hand this means that the 'optimal' error signal needs to be as wideband a signal as is possible. Considering this same issue from a more practical point of view, the same conclusion can be reached: the wider the allowed error signal bandwidth is, the more peak-heavy is the impulse response of the error signal and therefore the less additional EVM is caused due to frequency requirements compared to the hard-clipper in the case of individual peaks.

In respect of the peak EVM as stated above according to the GSM specifications, the maximum peak EVM value is, approximately 22%, and it is measured as an average of peak values from at least 200 bursts. The terms used in the cost function of equation (3) gives an absolute limit for the peak error, and therefore the cost function is not strictly related to the GSM standard.

In accordance with the invention, there is provided a technique in which a clipping signal is formed by creating a hard clipper residual signal, while simultaneously obtaining a wanted frequency response. Fitting may be achieved in the sense of Least Squares. Thus, a least squares clipper attempts to imitate the behavior of the ideal hard clipper. In practice, the purpose is to generate a signal such that the formed composite signal resembles the hard clipper type residual signal $y_T$ as much as possible, as discussed herein below.

The invention is further discussed in detail herein below with reference to the Figures, which illustrate example implementations for the invention.

FIG. 1 illustrates a block diagram of an exemplary implementation in accordance with the invention. The implementation includes an impulse generator 102, a delay element 104, and a set of complex filters 106a to 106d. The impulse generator 102 and the delay element 104 each receive the multi-carrier signal to be transmitted on line 300. The outputs of each of the complex filters on lines 122a to 122d are summed in summers 124a to 124c. The summed output is added to the output of the delay element on line 120 by summer 126. The output of the summer 126 on line 128 provides an input to a power amplifier (not shown).

The arrangement of FIG. 1 may be considered overall to be a 'PAR minimizer apparatus', and is effectively a pre-power amplifier stage. A multi-carrier signal to be transmitted is present on line 300.

The purpose of the impulse generator 102 and the complex filters 106 is to add an error signal to the multicarrier signal in line 300, such that the output PAR is minimized. The error signal, on line 123 at the output of summer 124a, is input to the second input of the mixer 126 where it is added to a delayed version of the multicarrier signal at the first input of the mixer 126 on line 120. The delay block 104 merely compensates for the processing delays in the impulse generator and the complex filters, which together may be considered an error block 101.

The added error signal on line 123 must fulfill the above-described frequency constraints and the peak and RVS EVM constraints. As discussed hereinabove, the "hard-clipper" provides an idealized result. Thus the signal on line 123 should approximate as closely as possible while fulfilling the additional constraints.

Referring to FIG. 3, there is illustrated an example implementation of the error impulse generator block 102 of FIG. 1. The signal on line 300 provides an input to a block 302 which generates a single residual signal on line 304. The residual signal on line 304 is the difference between the original transmitted signal on line 300 and a "hard-clipped signal". Thus it represents the error associated with hard-clipping.

The hard-clipped signal itself may be generated by limiting the maximum amplitude of the signal to be transmitted on line 300 to a predefined limit. The derivation of such a hard-clipped signal will be within the scope of one skilled in the art. The residual signal is then obtained by simply subtracting the hard-clipped signal from the original signal. Block 302 of FIG. 3 thus includes a hard-clipper and a substractor which operate on the signal on line 300 to produce the residual signal on line 304.

Thus the generated residual signal does not fulfill the frequency constraints (or other constraints) as discussed hereinabove. In order to fulfill the frequency constraints, a least squares technique is utilized in order to search a signal which is close as possible to the residual signal whilst fulfilling the frequency constraints.

The residual signal $y_T$ on line 304 forms an input to a least-squares fitting functional block 306. The least-squares fitting functional block 306 generates a series of outputs on lines 308a to 308d. The outputs of the least-squares fitting block on lines 308a to 308d are a set of generated impulse vectors $x_1, \ldots, x_{nro\_of\_carriers}$. The number of impulse vectors corresponds to the number of carriers in the multi-carrier signal, in the example shown four.

The least square fitting of the block 306 of FIG. 3 is used to find the best fit for the "hard-clipper" residual signal for each carrier such that the frequency constraints for each carrier frequency are fulfilled. The fitting criteria, in the described embodiments, are to minimize the squared difference (i.e. a least-squares optimization).

The impulse vectors $x_1, \ldots, x_4$ on lines 308a to 308d are thus preferably generated through the complex filters 106a to 106d, identified as $g_1, \ldots, g_4$ respectively. The clipper filters $g_i$ are specially designed for each carrier, so that each carrier has the same frequency characteristics as the transmitted signal. In practice the complex filters' coefficients are formed by up-converting the impulse of the transmitter's filter to each carrier's frequency. The outputs of the filters 106a to 106d are provided on lines 122a to 122d respectively.

FIG. 2 shows an example implementation of one of the complex filters in FIG. 1, for example the filter 106a. Each filter includes a transmitter filter 202, the input of which is formed by the input to the filter on line 308a, and the output of which on line 206 forms an input to a mixer 204. The mixer 204 serves to up-convert the signal on line 206 based on an up-convert frequency on line 208. The output of the mixer 204 forms the output of the filter on line 122a.

A mathematical analysis of the implementation shown in FIGS. 1 to 3 is given below.

The principle is to minimize a cost function which represents the squared distance between the "hard-clipper" residual signal and the output from the least-squares fitting block. That is, the output of the least-squares fitting block should approximate as closely as possible the "hard-clipper" residual signal. Thus by trying to minimize the cost function:

$$J = |y_T - Gx|^2,$$

where $G = (G_1 G_2 \ldots G_{nro\_of\_carriers})$, $G_i$ is a convolution matrix, whose columns are defined by $g_i$ and $x = (x_1 x_2 \ldots x_{nro\_of\_carriers})^T$ is a vector of impulse vectors, the following is obtained:

$$x_{min} = (G^H G)^{-1} G^H y_T.$$

It is known that $G_i^H G_j = \overline{O}$ (zero matrix), when $i \neq j$, hence $$x_i = (G_i^H G_i)^{-1} G_i^H y_T.$$

A solution is described herein below for solving the matrix equation above. This solution is too complex for practical implementations, but is presented for illustration purposes. This solution shows how the matrices in the result for x given above may be resolved.

FIG. 4 illustrates a modification to the arrangements of FIGS. 1 and 3 in which the complex filters 106 are replaced by complex filters 404.

The hard clipper type residual signal is generated and multiplied by a projection matrix $G_i(G_i^H G_i)^{-1} G_i^H$ of each carrier's spanned signal space. Signals are summed up, and deducted from the transmitted signal as described before. This is represented by FIG. 4. The hard clipper type residual signal is generated by block 400, which corresponds to the block 302 of FIG. 3, from the multicarrier signal. The hard clipper type residual signal forms an input to each of a plurality of complex filters 404a to 404d where the multiplication by the projection matrix takes place. The output of the filters 404a to 404d are summed in summers 406a to 406c, and subsequently summed by summer 408, to generate a multi-carrier signal on line 410 which drives a power amplifier.

Figure 5:
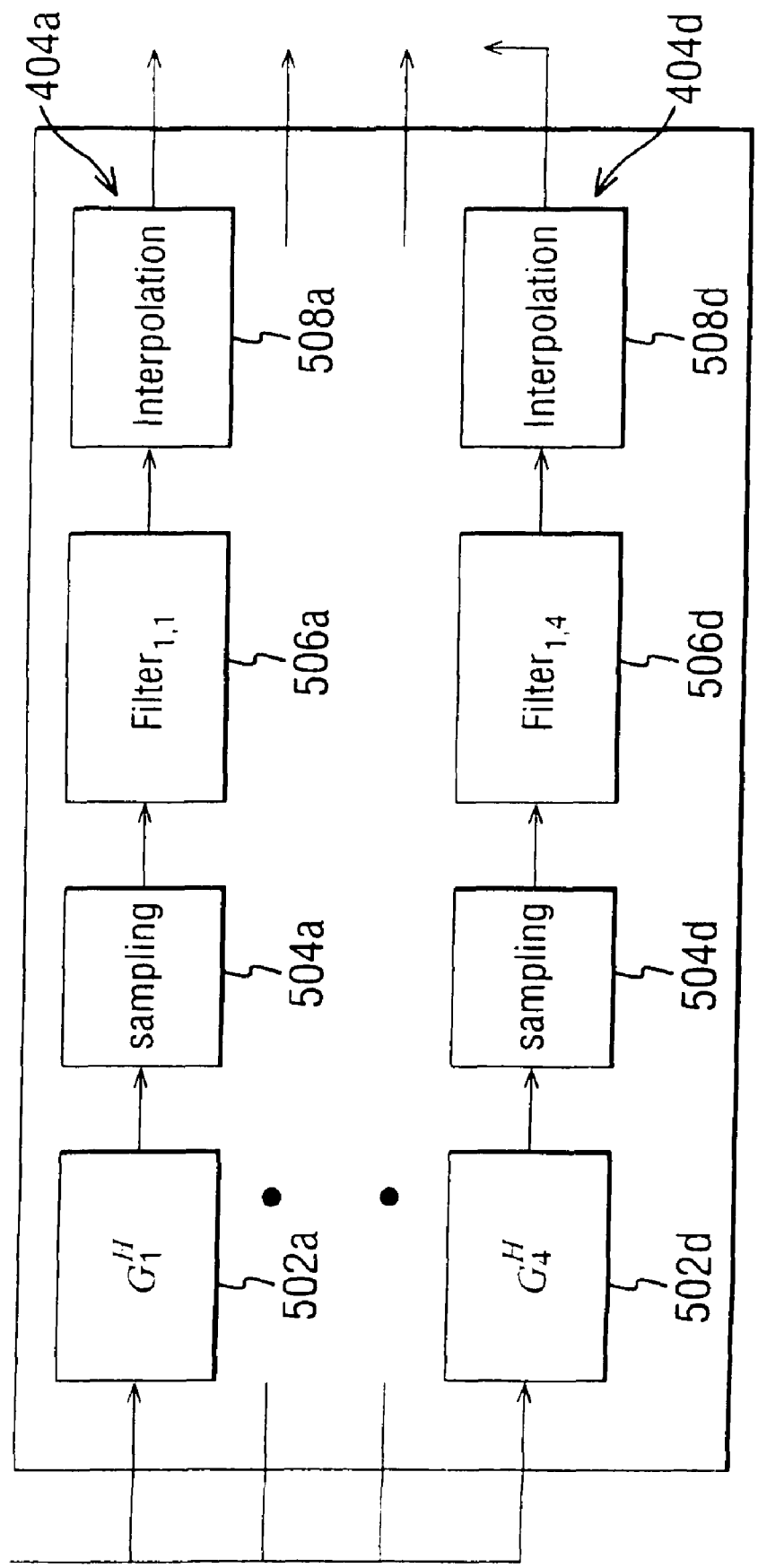
FIG. 5 illustrates an alternative example implementation of part of the implementation of FIG. 4 according to an embodiment of the invention.

The matrix solution can be simplified by filters as illustrated in FIG. 5. FIG. 5 represents a practical solution for the implementation of the complex filters 404a to 404d of FIG. 4. FIG. 5 illustrates an approximation of the filters of FIG. 4. Even when the clipper become feasible it impairs the results slightly.

As shown in FIG. 5, each filter 404a to 404d may include a matrix function 502a to 502d, a sampling function 504a to 504d, a filter 506a to 506d, and an interpolation function 508a to 508d. The residual signal is operated with the transpose of a complex conjugation matrix (i.e. a matched filter) G, represented by blocks 502a to 502d. In these solutions the matrix inversion $(G^H G)^{-1}$ is replaced by the ISI removal filter$_{x,y}$, represented by blocks 506a to 506d.

The invention has been described herein by way of a reference to particular examples. The invention is not limited to such examples, or aspects thereof. The scope of the present invention is defined by the appended claims.

The invention claimed is:

1. A method comprising:
generating a residual signal from a multicarrier signal, the residual signal representing a difference between the multicarrier signal and a hard-clipped multicarrier signal;
applying a least squares function to the residual signal for at least one carrier of the multicarrier signal, thereby generating a minimized residual signal for each of the at least one carrier;
filtering the minimized residual signals; and
combining the filtered minimized residual signals and the multicarrier signal.

2. A method according to claim 1 further comprising delaying the multicarrier signal, wherein combining the filtered minimized residual signals and the multicarrier signal comprises combining the filtered minimized residual signals and the delayed multicarrier signal.

3. A method according to claim 1, wherein the generating the residual signal includes clipping the multicarrier signal to a predetermined level to thereby generate the hard-clipped multicarrier signal.

4. A method according to claim 1, wherein the filtering comprises complex filtering.

5. The method according to claim 4, wherein the complex filtering comprises applying at least one of a matrix function, a sampling function, a filter, or an interpolation function to the at least one minimized residual signal.

6. The method according to claim 1, wherein combining the filtered minimized residual signals and the multicarrier signal comprises adding the filtered minimized residual signals to the multicarrier signal.

7. The method according to claim 1, wherein generating a minimized residual signal for each of the at least one carrier comprises generating a set of impulse vectors, the number of impulse vectors in the set corresponding to the number of carriers in the multicarrier signal.

8. An apparatus comprising:
a generator configured to generate a residual signal from a multicarrier signal, the residual signal representing a difference between the multicarrier signal and a hard-clipped multicarrier signal;
an applying unit configured to apply a least squares function to the residual signal for at least one carrier of the multicarrier signal, thereby generating a minimized residual signal for each of the at least one carrier;
at least one filter, the at least one filter configured to filter the minimized residual signals; and
a combining unit configured to combine the filtered minimized residual signals and the multicarrier signal.

9. Apparatus according to claim 8, further comprising a delaying unit configured to delay the multicarrier signal, wherein the combining unit is configured to combine the filtered minimized residual signals and the multicarrier signal by combining the filtered minimized residual signals and the delayed multicarrier signal.

10. Apparatus according to claim 8, wherein the generator includes a clipper configured to clip the multicarrier signal to a predetermined level to thereby generate the hard-clipped multicarrier signal.

11. Apparatus according to claim 8, wherein the at least one filter comprises a complex filter.

12. The apparatus according to claim 11, wherein the complex filter comprises at least one of a matrix function, a sampling function, a filter, or an interpolation function.

13. A system comprising:
a transmitter apparatus configured to reduce a peak-to-mean ratio of a multicarrier signal;
a generating unit configured to generate a residual signal from a multicarrier signal, the residual signal representing a difference between the multicarrier signal and a hard-clipped multicarrier signal;
an applying unit configured to apply a least squares function to the residual signal for at least one carrier of the multicarrier signal, thereby generating a minimized residual signal for each of the at least one carrier;
at least one filter, the at least one filter configured to filter the minimized residual signals; and
a combining unit configured to combine the filtered minimized residual signals and the multicarrier signal.

14. The system according to claim 13, wherein said generating unit, said applying unit and said combining unit are implemented in a Global System for Mobile communications (GSM) Enhanced Data rates for GSM Evolution (EDGE) mobile communication system.

15. An apparatus comprising:
generating means for generating a residual signal from a multicarrier signal, the residual signal representing a difference between the multicarrier signal and a hard-clipped multicarrier signal;
applying means for applying a least squares function to the residual signal for at least one carrier of the multicarrier signal, thereby generating a minimized residual signal for each of the at least one carrier;
filtering means for filtering the minimized residual signals; and
combining means for combining the filtered minimized residual signals and the multicarrier signal.

16. A system comprising:
transmitting means for reducing a peak-to-mean ratio of a multicarrier signal;

generating means for generating a residual signal from the multicarrier signal, the residual signal representing a difference between the multicarrier signal and a hard-clipped multicarrier signal;

applying means for applying a least squares function to the residual signal for at least one carrier of the multicarrier signal, thereby generating a minimized residual signal for each of the at least one carrier;

filtering means for filtering the minimized residual signals; and combining means for combining the filtered minimized residual signals and the multicarrier signal.

17. An apparatus comprising:

a generator configured to generate a residual signal from a multicarrier signal, the residual signal representing a difference between the multicarrier signal and a hard-clipped multicarrier signal;

a least squares fitter configured to apply a least squares function to the residual signal for at least one carrier of the multi-carrier signal, thereby generating a minimized residual signal for each of the at least one carrier;

at least one filter, the at least one filter configured to filter the minimized residual signals; and a summer configured to combine the filtered minimized residual signals and the multicarrier signal.

18. The apparatus according to claim 17, wherein the generator comprises:

a hard-clipper configured to generate a hard-clipped signal from the multicarrier signal; and a subtractor configured to generate the residual signal by subtracting the hard-clipped signal from the multicarrier signal.

19. The apparatus according to claim 17, further comprising:

a delay element configured to delay the multicarrier signal, wherein the mixer is configured to combine the filtered minimized residual signals and the multicarrier signal by combining the filtered minimized residual signals and the delayed multicarrier signal.

20. The apparatus according to claim 17, wherein the least squares fitter is configured to apply a least squares function to the residual signal for each carrier of the multi-carrier signal, thereby generating a set of impulse vectors, the number of impulse vectors in the set corresponding to the number of carriers in the multicarrier signal.

* * * * *